(12) United States Patent
Chung et al.

(10) Patent No.: US 7,350,177 B2
(45) Date of Patent: Mar. 25, 2008

(54) CONFIGURABLE LOGIC AND MEMORY DEVICES

(75) Inventors: Shine Chien Chung, Taipei Hsien (TW); Yung-Chin Hou, Taipei (TW); Kun Lung Chen, Taipei (TW); Yu-Chun Wu, Allentown, PA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 211 days.

(21) Appl. No.: 11/180,936

(22) Filed: Jul. 13, 2005

(65) Prior Publication Data
US 2005/0248366 A1 Nov. 10, 2005

Related U.S. Application Data

(63) Continuation-in-part of application No. 11/119,086, filed on Apr. 29, 2005.

(60) Provisional application No. 60/566,684, filed on Apr. 29, 2004.

(51) Int. Cl.
*G06F 17/50* (2006.01)

(52) U.S. Cl. .......................................... 716/16; 716/19
(58) Field of Classification Search .................... 716/1, 716/16–17, 19; 326/38–41, 46, 101, 113
See application file for complete search history.

(56) References Cited

U.S. PATENT DOCUMENTS

| 2003/0071658 A1* | 4/2003 | Yamashita et al. ........... 326/113 |
| 2007/0030027 A1* | 2/2007 | Madurawe ................... 326/38 |

* cited by examiner

*Primary Examiner*—Paul Dinh
(74) *Attorney, Agent, or Firm*—Kirkpatrick & Lockhart Preston Gates Ellis LLP

(57) ABSTRACT

A configurable logic and memory block (CLMB) and a configurable logic device are disclosed. The CLMB includes one or more static random access memory (SRAM) cells, a first output module for generating a first output by reading at least one SRAM cell when the CLMB functions as an SRAM, a second output module for generating a second output by reading at least one SRAM cell when the CLMB functions as a program logic device (PLD), wherein data on one or more bitlines coupled to the SRAM cells are controllably feeding into the first and second output modules. The configurable logic device can provide various Boolean logic functions using pass gates.

15 Claims, 6 Drawing Sheets

300

$F1=(A'+B+C)'+(B+C)'$
$=AB'C'+B'C$ $F2=(A'+B'+C)'+(A+B+C)'$
$=ABC'+A'B'C'$

| | I0 | I1 | C | F |
|---|---|---|---|---|
| 1 | A' | A' | B | NXOR |
| 2 | A' | A | B | XOR |
| 3 | A' | 0 | B | AB |
| 4 | A' | 0 | B | A'B |
| 5 | A' | 0 | B' | AB' |
| 6 | A' | 1 | B' | A'B' |
| 7 | A' | 1 | B | A+B' |
| 8 | A' | 1 | B | A'+B' |

| | I0 | I1 | C | F |
|---|---|---|---|---|
| 9 | A' | 1 | B | A'+B' |
| 10 | A | 1 | B' | A+B |
| 11 | A' | 0 | 1 | A |
| 12 | 1 | 0 | 1 | A' |
| 13 | 1 | 0 | B | B |
| 14 | 1 | 0 | B' | B' |
| 15 | 1 | 0 | 1 | 1 |
| 16 | 0 | 0 | 1 | 0 | ions, customization may take place
CONFIGURABLE LOGIC AND MEMORY DEVICES

CROSS REFERENCE

The present application is a Continuation-In-Part of U.S. application Ser. No. 11/119,086, which was filed on Apr. 29, 2005 and whose content is incorporated by reference herein, which further claims the benefit of U.S. Provisional Application Ser. No. 60/566,684 filed on Apr. 29, 2004, and entitled "SYSTEM ON CHIP DEVELOPMENT WITH RECONFIGURABLE MULTI-PROJECT WAFER TECHNOLOGY."

BACKGROUND

The present invention relates generally to semiconductor devices, and more particularly to programmable logic and memory devices whose configurations are customizable at the end of the fabrication process, thereby reducing design costs and time to market.

In this sophisticated mobile computing age, consumers increasingly demand complex technologies with a myriad of functionalities that consumes little electrical power. In order to fit as many customized functionalities into the smallest and the most power-efficient integrated circuits (ICs) designs as possible, semiconductor manufacturers typically use standard or custom cells, which provide pre-designed, power-efficient application functions to the overall IC.

One issue with respect to standard or custom cells is that they comprise devices that are hardwired for specific functions. As such, they are inflexible to further design changes. As cost of production gets more expensive and as time-to-market requirements become more stringent, even hardwired cells may need some configurability.

Recent technological advances allow semiconductor manufacturers to embed some programmable technologies into ICs. For example, Complex Programming Logic Device (CPLD) and Field-Programmable Gate Array (FPGA) are recently developed technologies that semiconductor manufacturers embed into the overall IC. However, these technologies are understood by those skilled in the art that, compared to standard cell designs, they use wafer space inefficiently and exhibit lower device performance. For example, FPGA is ineffective because it typically requires 40 times more space than, and performs at a 20 to 30% discount to, devices in standard cells. By contrast, CPLD has slightly better spatial effectiveness and performance ratings. Despite the fact that CPLD is less configurable than FPGA, it is the preferred choice when the size of the embedded logic in IC designs is small. However, CPLD building blocks may only be used in simple and small size logic designs and, if they are not initially designed for use, they are practically unusable after the design phase is complete.

Another conventional strategy is to embed custom cells in programmable technologies such as CPLD or FPGA. These custom cells still provide fixed and specific functionalities in a design that is still predominated by programmable devices. However, there is currently no effective and efficient way of achieving the reverse, that is, to embed programmable devices or memory in a standard/custom cell environment.

It is therefore desirable to introduce additional standard design methodology that may allow improved configurability, such that the building blocks not particularly configured for specific purposes may be used for generic purposes such as generic memory storage and/or generic logic with only a few mask layers for customization.

SUMMARY

In view of the foregoing, this present invention provides systems and methods that allow improved configurability of ICs, such that the building blocks in the ICs not particularly configured for specific purposes may be used for generic purposes such as generic memory storage and/or generic logic with only a few mask changes.

In a first embodiment, a configurable logic and memory block (CLMB) is disclosed. The CLMB presented may have a plural of memory cells, a write control input, and a read control input. When only one control input is used at a time, this CLMB behaves like an SRAM. If both the read and write control inputs are accessed simultaneously, the CLMB is a two-port SRAM. If the write control input is used to configure data into the cells, and then the read control input is used for data access, the CLMB behaves like an SRAM-configurable PLD, if the outputs are equipped with NOR gates. With input and output configuration, the CLMB can be used to implement SRAM, two-port SRAM, PLD, CPLD or a combination of the above with only a few mask changes, thereby reducing development time and costs.

In a second embodiment, a configurable logic device is disclosed that can provide various Boolean logic functions using pass gates. This design methodology may be utilized for more efficient logic implementation and faster logic speed than FPGA. The reconfigurable logic system is programmable through the use of connection masks to implement a plurality of logic or Boolean operations. Because these new programming masks can be implemented at the end of the fabrication process, customization may take place without a substantial increase in either developing time or cost.

The construction and method of operation of the invention, however, together with additional objects and advantages thereof will be best understood from the following description of specific embodiments when read in connection with the accompanying drawings.

DESCRIPTION

This present invention provides methods that allow improved configurability of ICs, such that the building blocks in the ICs not particularly configured for specific purposes may be used for generic purposes such as generic memory storage and/or generic logic with only a few mask changes.

Figure 1A:
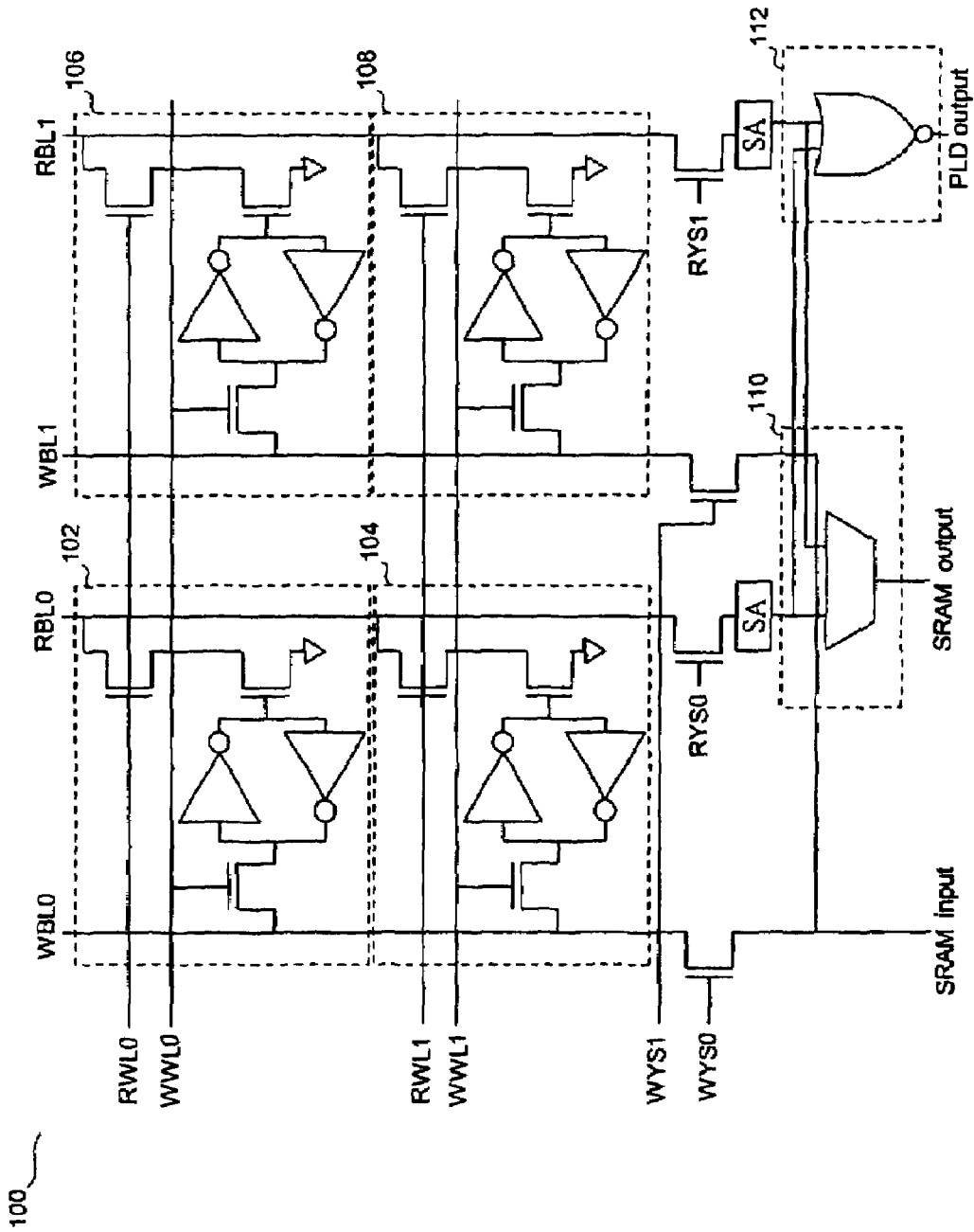
FIG. 1A illustrates an embedded memory device in accordance with a first embodiment of the present invention.

FIG. 1A illustrates a configurable logic and memory block (CLMB) 100 in accordance with a first embodiment of the present invention. In this embodiment, the CLMB 100 has a standard SRAM device with additional circuit components so that the SRAM device can also be used as a programmable logic device. The CLMB 100 is a two-output-port device, the first port of which is used for returning static random access memory (SRAM) output and the second port of which is used for returning programmable logic device (PLD) output. In this embodiment, the CLMB 100 includes four standard memory cells 102, 104, 106 and 108. Data in any of the standard memory cells may be written to or read from through two pairs of read/write word-lines: RWL0/WWL0 and RWL1/WWL1, and two pairs of read/write bit-lines: RBL0/WBL0 and RBL1/WBL1.

For SRAM write operations, the CLMB 100 first selects either write-select command-line WYS0 or WYS1. Data are then passed to either write bit-line WBL0 or WBL1. By further selecting either write word-line WW0 or WW1, data are written to one of the four standard memory cells. For example, to write to the cell 102, both WYS0 and WWL0 are selected. For SRAM read operations, by selecting either read word-line RWL0 or RWL1, data are passed to either read bit-line RBL0 or RBL1 from two of the four standard memory cells. By further selecting either read-select command-line RYS0 or RYS1, data may be read from either the read bit-line RBL0 or RBL1. For example, to read from the cell 104, both RWL1 and RYS0 are selected. By passing signals through a sense amplifier SA and further through an SRAM output module 110 to an output line, SRAM read operations can be realized. It is noted that the SRAM output module 110 is a multiplexer based one that selects one of the column outputs as its output.

To use the CLMB 100 as a PLD device, memory cells are first written with predefined bits (i.e. 0 or 1) through the write bit-lines. The read output lines or the bitlines coupled to the memory cells can then be used to read data from the CLMB 100 as though it is a lookup table. In this example, a PLD output module 112 includes a NOR gate, which can be used as an OR output in a programmable array logic (PAL). There is a PLD output control signal RYS1, which is the same as the regular bitline selection signal, that feeds the data on the bitline to the sense amplifier, which is also a typical component, and then to the output module, e.g., the NOR gate. Another input of the NOR gate is from the neighboring bitline.

For the purpose of this illustration, the CLMB 100 has one SRAM output line and one PLD output line. While it is illustrated that the two output lines are for SRAM and PLD, it is understood by those skilled in the art that this is merely an illustrative example of how the CLMB 100 may be designed for both SRAM and PLD functions, and that the modules 110 and 112 are interchangeable in other embodiments to cater to different final IC design requirements without deviating from the spirit of this invention. The present invention provides the flexibility for a hardwired ASIC to embed both a programmable logic and memory modules. As illustrated above, the SRAM device can now be configured into a single port SRAM, a two-port SRAM, PLD, CPLD, and any combinations of them.

Figure 1C:
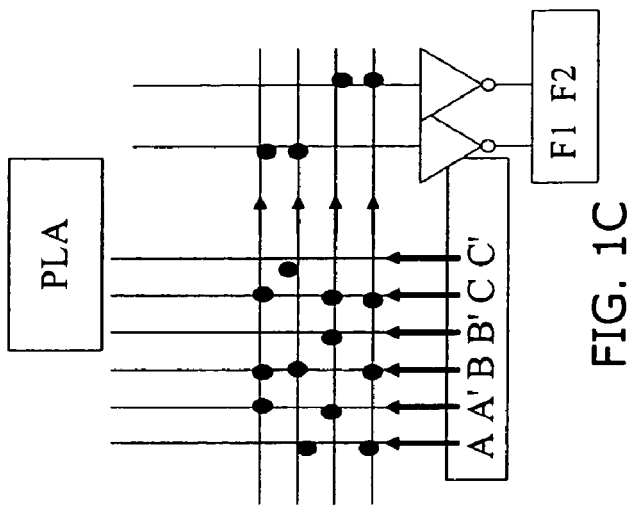
FIG. 1B-1D illustrates a PAL and a PLA in accordance with the first embodiment of the present invention.
Figure 1D:
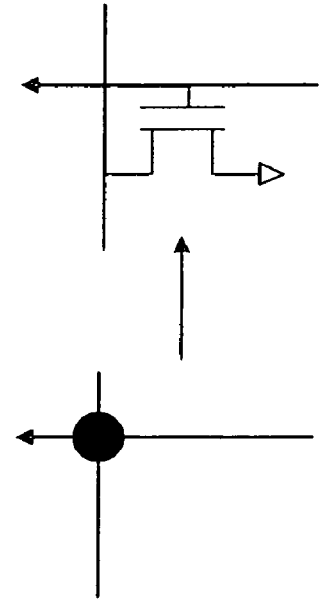
Figure 1B:
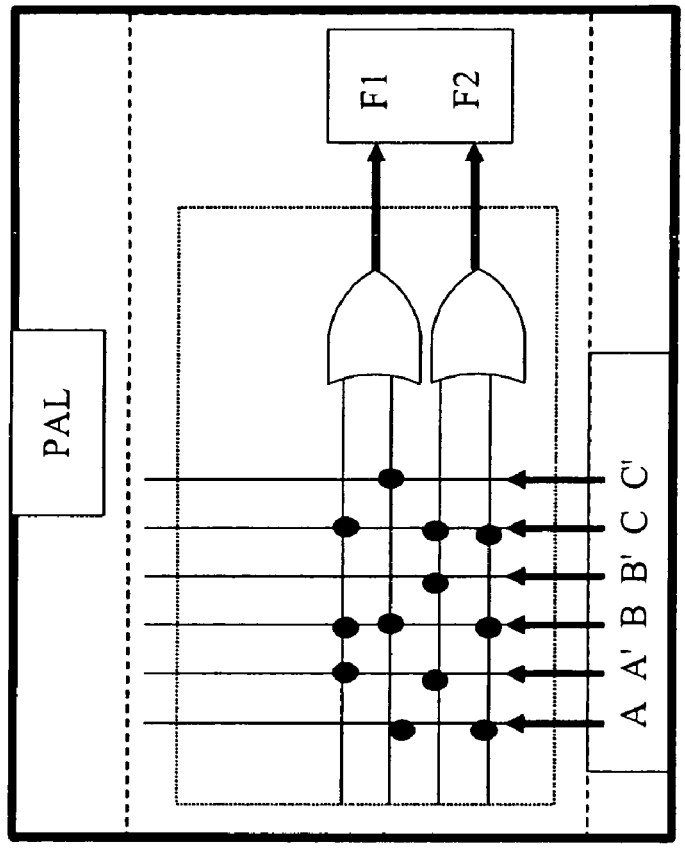

This structure can also be used to implement a programmable logic array (PLA), if a similar block is placed with the array. Any Boolean logic can be expressed as a combination of one or more AND-OR terms, which can be further expressed as NOR-NOR terms according to DeMorgan's law. Typically, the PLA has two planes implementing the NOR terms. It may allow both NOR planes to be programmable to realize any Boolean function, while Programmable Array Logic (PAL) allows the first NOR plane to be programmable but keeps the second NOR hardwired. The CLMB can be used to implement the NOR plane for either the PLA or the PAL by using this SRAM-based lookup-table cell. FIG. 1B illustrate a PAL module providing two outputs F1 and F2 based on a combination of inputs, e.g., A-C and A'-C'. FIG. 1C illustrates a PLA module producing the outputs F1 and F2 based on a combination of inputs, e.g., A-C and A'-C' in accordance with one embodiment of the present invention. The actual circuit connection for the "dots" presented in FIGS. 1B and 1C are shown in FIG. 1D.

In essence, the CLMB presented may have a plural of memory cells, a write control input, and a read control input. When only one control input is used at a time, this CLMB behaves like an SRAM. If both the read and write control inputs are accessed simultaneously, the CLMB is a two-port SRAM. If the write control input is used to configure data into the cells, and then the read control input is used for data access, the CLMB behaves like an SRAM-configurable PLD, if the outputs are equipped with NOR gates. With input and output configuration, the CLMB can be used to implement SRAM, two-port SRAM, PLD, CPLD or a combination of the above with only a few mask changes, thereby reducing development time and costs.

Figure 2:
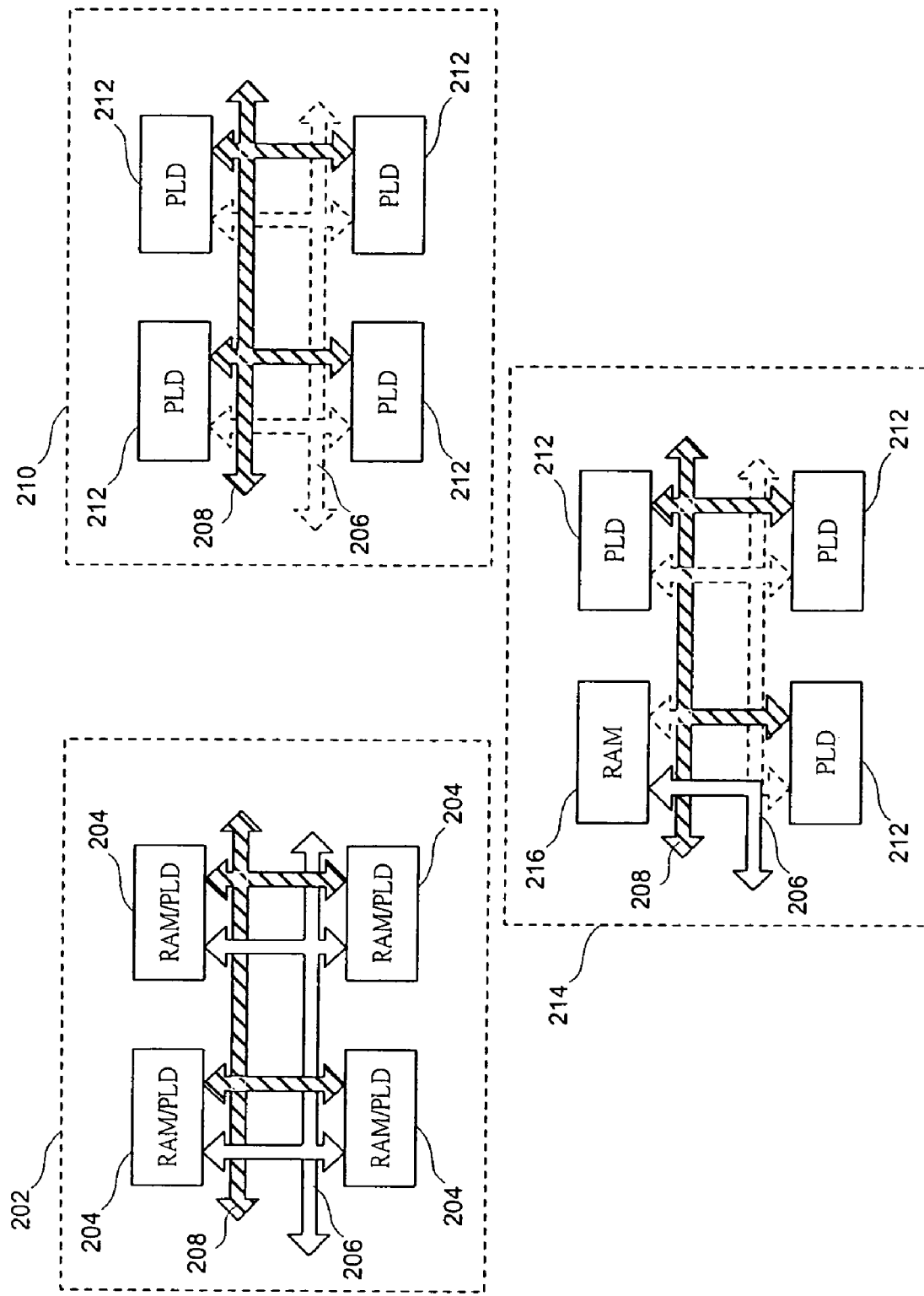
FIG. 2 illustrates three production variations of a two-by-two array of four embedded memory devices in accordance with the first embodiment of the present invention.

FIG. 2 illustrates three production variations of a two-by-two array of four memory devices 100 in accordance with the first embodiment of the present invention. A first production variation 202 shows the use of four devices 204 configured and interconnected by a data bus 206 for communication among the SRAM outputs of the devices 204. Each of the devices 204 is equivalent to the CLMB 100 as shown in FIG. 1. A data bus 208 is used for communication among the PLD outputs of the devices 204. In other words, in the first production variation 202, four SRAM output lines as well as four PLD output lines are designed to be used. A second production variation 210 shows the use of four devices 212 interconnected by the data bus 208 for communication among the PLD outputs of the devices 212. The device 212 is equivalent to the CLMB 100 as shown in FIG. 1, except that the SRAM outputs are unused. Therefore, the data bus 206 is also unused, as illustrated by the dotted lines. In other words, in the second production variation 210, only four PLD output lines and no SRAM output lines are designed to be used. A third production variation 214 shows the use of a device 216 and three devices 212. The device 216 is equivalent to the CLMB 100 as shown in FIG. 1, except that the PLD output is unused. Because there is only one SRAM-available block, the data bus 206 exits directly to an external circuitry. Meanwhile, the data bus 208 communicates among the three PLD blocks. It is noteworthy that the data bus 208 does not communicate with the device 216 since, as defined earlier, the PLD output of the device 216 is unused. It is understood that other variations, including other X-by-Y array variations and output line design variations, may be used to implement a memory system to be included in an overall IC design. For example, the production variation 202 may be used to implement a two-by-two memory and PLD array. By using the cells both as a SRAM memory cell and as a PLD logic table cell, more flexibility can be achieved, because unused devices may be interchanged and used for different purposes accordingly. For example, the inputs in the PAL NOR gates can be configured to suit different applications. In another example, the SRAM and PLD outputs are further multiplexed into a single output. This interchange configuration may be achieved at the end of the fabrication process with only a few mask changes, thereby reducing customization costs and time to market. In other words, this invention provides a significant advantage in that it allows designers to trade resources between SRAM, two-port SRAM, and PLD devices without requiring a redesign of the production process.

Figures 3A, 3B:
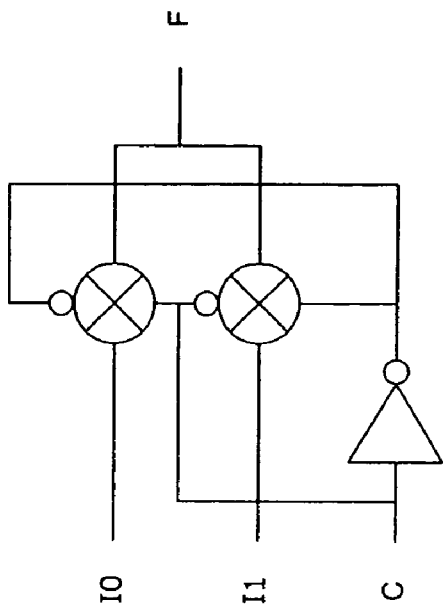
FIG. 3A illustrates a configurable logic device in accordance with a second embodiment of the present invention.
FIG. 3B presents a tabulation of the logic that may be performed by the configurable two-input logic device in accordance with the second embodiment of the present invention.

FIG. 3A illustrates a programmable pass gate based configurable logic device 300 in accordance with a second embodiment of the present invention. The configurable logic device 300 is a multiplexer-based device that can implement any two-input Boolean outputs. There are some prior art references using full CMOS logic to implement Universal Logic Gates, but they all consume too much area and are too slow to be effective.

In this example, the configurable logic device 300 has three inputs I0, I1, and C and one output F. Two pass gates are connected in series and used for generating a combinational logic based on the value delivered at the three inputs. As it is understood in the art, a pass gate usually receives an input, and based on two control signals that control the opening or closing of the pass gate, generates an output. The two inputs I0 and I1 feed into two pass gates and the outputs of the two pass gates jointly deliver the output F. In this embodiment, the control signal C and its complementary one are used to control the switching of these two gates. It is preferred that way as no floating gate and no device fighting are found in the design. As shown, the top pass gate is controlled by C and C' to pass the input I0 to F, while the lower pass gate is controlled by C' and C to pass the input I1 to F. As such, at any moment, either I0 or I1 becomes F.

Metal lines (not shown) may be used to configure the configurable logic device 300. By selectively placing metal or via interconnects at various locations, the configurable logic device 300 may be reconfigured to perform any two-input logic functions, some of which are tabulated in FIG. 3B. Essentially, the configurable logic device 300 is mask programmable by strategically placing via interconnects and/or metal interconnects. It is further understood that latches and/or flip-flops may be similarly implemented using a plural of devices 300. In essence, any Boolean logic can be implemented by using many devices 300 through an interconnect network.

FIG. 3B presents a tabulation 302 of some of the logic that may be performed by the configurable logic device 300 in accordance with the second embodiment of the present invention. As shown, the three inputs of the device may be connected to input data or their complementary signals, or fixed to logic 1 or 0 by connecting to a positive supply voltage or ground based on a particular Boolean function needed. For example, by varying the three inputs I0, I1 and C, any two-input Boolean functions F may be achieved. For example, an exclusive-OR logic may be implemented by feeding A', A and B to I0, I1 and C, respectively, and by selectively placing metal or via interconnects as previously explained. It is understood by those skilled in the art that A' is the inverse of A, just as B' is the inverse of B.

Figure 4:
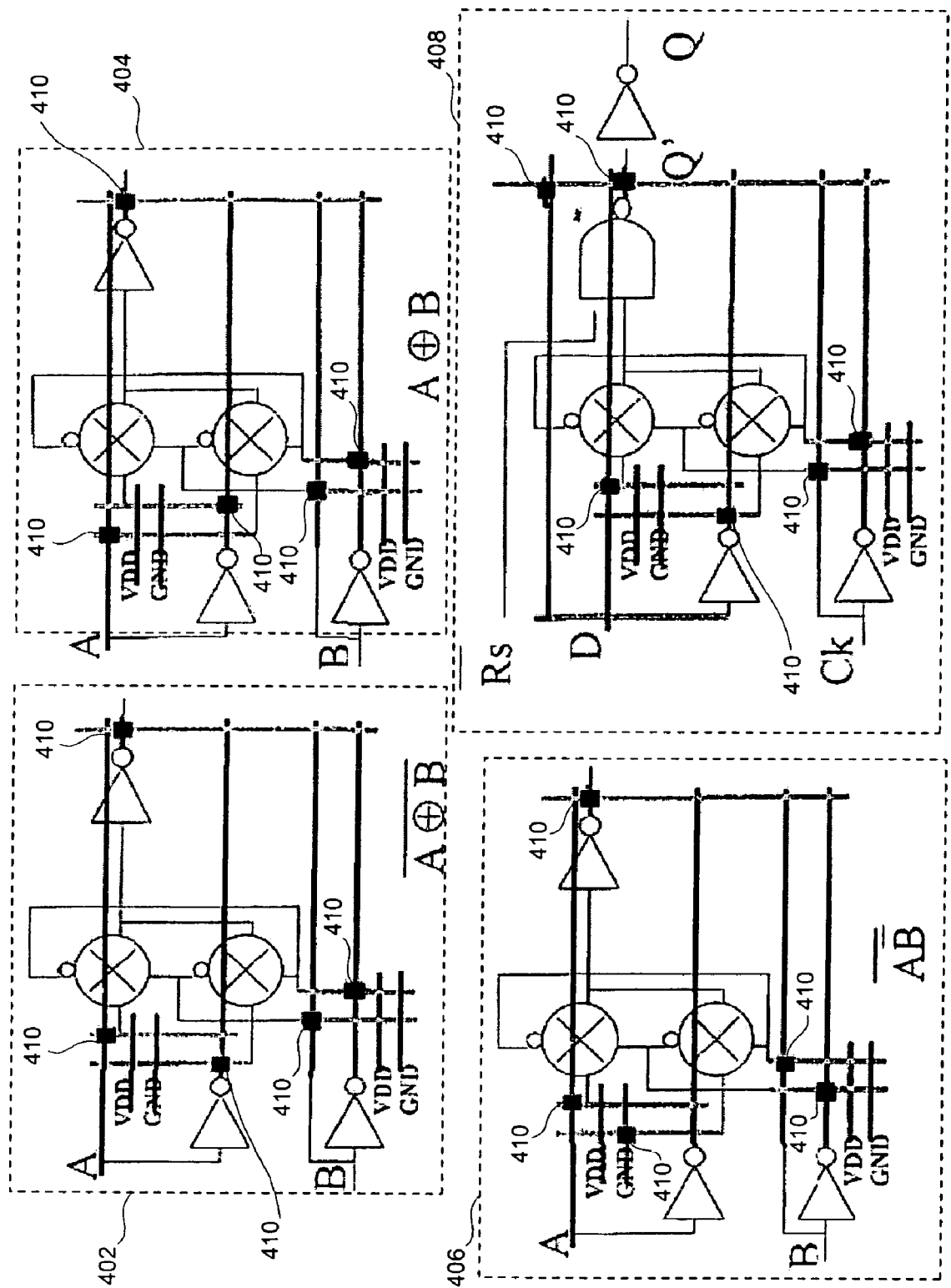
FIG. 4 illustrates four production variations of the configurable logic device in accordance with the second embodiment of the present invention.

FIG. 4 illustrates four production variations 402, 404, 406 and 408 of the configurable logic device 300 in accordance with the embodiments of the present invention. The production variations are achieved by strategically placing via interconnects, which may be achieved in the last few layers of the fabrication process. The production variations utilize the configurable logic device 300 as shown in FIG. 3A, but also include various mask-generated via interconnects 410 to obtain the desired interconnect scheme for the desired output function. For example, the production variation 402 includes five mask-generated via interconnects 410 to provide the output logic function Exclusive NOR (XNOR). The production variation 404 includes five mask-generated via interconnects 410 to provide the output logic function Exclusive OR (XOR). The production variation 406 includes five mask-generated via interconnects 410 to provide the logic function (NOT (A NOT B)). The production variation 408 includes six mask-generated via interconnects 410 as well as additional gate circuitry to form a latch circuit having a clock input Ck, a reset input Rs and a latched output Q.

An array having many of these production variations may be designed to implement a reconfigurable logic system to be used in an overall IC design. Since the pass gates are the key component of the reconfigurable logic system, it is relatively more practical to realize this in the fabrication process. For example, the programming to achieve this implementation may be performed at the end of the fabrication process (typically at the final two metal layers in fabrication), custom logic may be implemented into the overall IC design at a much lower cost. In addition, the number of gates used for such a reconfigurable logic module is small. For example, a 2-input Boolean function can be implemented by no more than 10 transistors, and any 3-input Boolean function can be implemented by cascading two devices 300, or using a single device like 300 but with a more complicated configuration.

Figure 5:
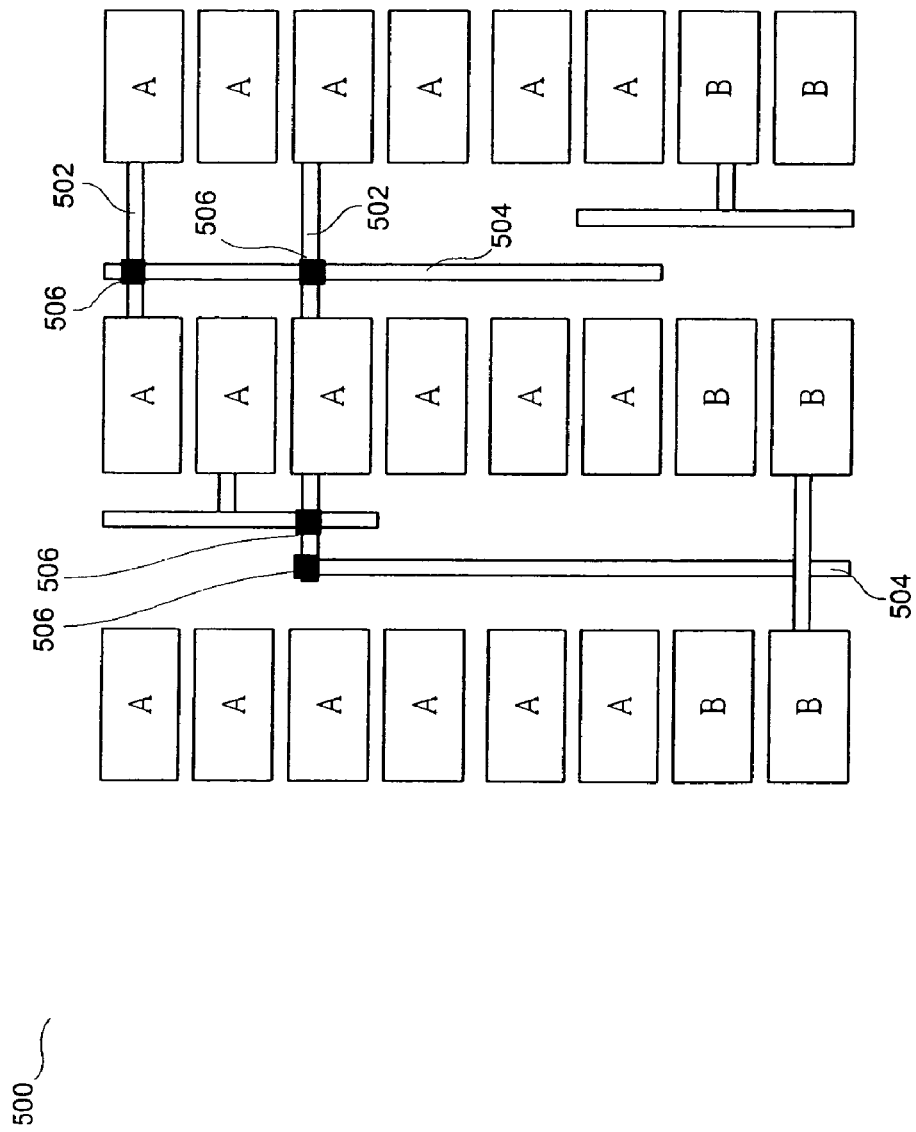
FIG. 5 illustrates an example of a two-dimensional switch array that allows metal or via interconnects for global routing of logic signals in accordance with the second embodiment of the present invention.

FIG. 5 illustrates an example of a two-dimensional switch array 500 that allows via interconnects for global routing of logic signals in accordance with the embodiments of the present invention. As an example, the switch array includes "A" cells (production variations 402, 404 and 406) and "B" cells (production variation 408) that are interconnected by horizontal metal interconnects 502, vertical metal interconnects 504 as well as via interconnects 506. With both "A" and "B" cells, any combinational or sequential logic can be implemented. In this example, there is one "B" cell for every three "A" cells. The array 500 may be used to implement a reconfigurable logic system in an overall IC design, with metal or via interconnects formed in the last few layers of the fabrication process.

In this disclosure, the CLMB 100 and the configurable logic device using pass gates 300 allow the formation of a memory system and a reconfigurable logic system, respectively. Since these systems are easily customizable because customization may be performed in the last two metal layers, they may be implemented in the overall IC design and provide defined functionalities without a corresponding increase in design cost and time. It is understood that the customizable memory system and reconfigurable logic system can be a part of an adaptive SOC. The flexibility of these CLMB can be further enhanced in that they can be implemented on a multi-project wafer as well.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A programmable pass gate based configurable logic device for providing one or more Boolean functions, the device comprising:
   a first pass gate receiving a first input;
   a second pass gate for receiving a second input;
   a third input and its complementary signal coupled to the first and second pass gates as gate control signals; and
   one or more mask-generated via and metal interconnects for providing one or more Boolean functions,
   wherein the one or more mask-generated via and metal interconnects are formed at a later stage of the fabrication process for selectively connecting the first, second and third inputs with a positive voltage supply, ground, and two input data and their complementary signals, and
   wherein outputs of the first and second pass gates form a joint output, and the first input, second input, and the third input are programmed to provide a two-input Boolean function at the output.

2. The device of claim 1 wherein the first input is connected to a first data or its complementary signal for one or more Boolean functions.

3. The device of claim 2 wherein the second input is the complementary signal of the first data for one or more Boolean functions.

4. The device of claim 1 wherein the second input is fixed as 1 or 0 for one or more Boolean functions.

5. The device of claim 4 wherein the third input is a second data or its complementary signal for one or more Boolean functions.

6. The device of claim 4 wherein the third input is fixed as 1 for one or more Boolean functions.

7. The device of claim 1 wherein the one or more Boolean functions include constants, (0 or 1), unitary, and any two-input Boolean functions by varying the first input, second input, and the third input.

8. The device of claim 1 wherein the Boolean functions are realized by mask programming using one or more metal connections for selectively connecting the first, second and third inputs with a positive voltage supply, ground, and two input data and their complementary signals.

9. The device of claim 1 wherein the Boolean functions are realized by mask programming using one or more via connections for selectively connecting the first, second and third inputs with a positive voltage supply, ground, and two input data and their complementary signals.

10. A programmable pass gate based configurable logic device for providing one or more Boolean functions, the device comprising:
    a first pass gate receiving a first input;
    a second pass gate for receiving a second input; and
    a third input and its complementary signal coupled to the first and second pass gates as gate control signals; and
    one or more mask-generated via and metal interconnects for providing one or more Boolean functions,
    wherein outputs of the first and second pass gates form a joint output, and the first input, second input, and the third input are programmed to provide a two-input Boolean function at the output, and
    wherein the Boolean functions are realized by mask programming using the one or more mask-generated via and metal interconnects formed at a later stage of the fabrication process for selectively connecting the first, second and third inputs with a positive voltage supply, ground, and a first and a second data and their complementary signals.

11. The device of claim 10 wherein the Boolean functions include constants, unitary, and any two-input functions by varying the first input, second input, and the third input.

12. The device of claim 11 wherein the first input is connected to the first data or its complementary signal for one of the Boolean functions.

13. The device of claim 11 wherein the second input is the complementary signal of the first data for NXOR or XOR operation.

14. The device of claim 10 wherein the second input is fixed as 1 or 0 and the third input receives a second data or its complementary signal for AND or OR operations.

15. The device of claim 10 wherein the first or second input receives data while the other inputs are fixed at 1 or 0 for an inversion operation.

* * * * *